United States Patent
Dunn et al.

(10) Patent No.: US 11,553,631 B2
(45) Date of Patent: Jan. 10, 2023

(54) SYSTEMS AND METHODS FOR REMOVING AN ADHESIVELY-ATTACHED COMPONENT FROM A CIRCUIT BOARD ASSEMBLY

(71) Applicant: Raytheon Company, Waltham, MA (US)

(72) Inventors: Michael Spencer Dunn, Andover, MA (US); Lawrence William Thurber, Tewksbury, MA (US)

(73) Assignee: RAYTHEON COMPANY, Waltham, MA (US)

( * ) Notice: Subject to any disclaimer, the term of this patent is extended or adjusted under 35 U.S.C. 154(b) by 75 days.

(21) Appl. No.: 17/100,285

(22) Filed: Nov. 20, 2020

(65) Prior Publication Data

US 2022/0167536 A1 May 26, 2022

(51) Int. Cl.
| | |
|---|---|
| *B23K 1/00* | (2006.01) |
| *B23K 3/00* | (2006.01) |
| *B23K 37/00* | (2006.01) |
| *H05K 13/04* | (2006.01) |
| *H05K 3/34* | (2006.01) |
| *B23K 1/018* | (2006.01) |

(52) U.S. Cl.
CPC ......... *H05K 13/0486* (2013.01); *B23K 1/018* (2013.01); *H05K 3/3494* (2013.01)

(58) Field of Classification Search
CPC ......... H05K 3/3494; H05K 2203/0195; H05K 13/0486; H05K 2203/101; H05K 2203/176; B23K 1/018; B23K 3/04; B23K 1/002; H01L 24/98
See application file for complete search history.

(56) References Cited

U.S. PATENT DOCUMENTS

| | | | | |
|---|---|---|---|---|
| 5,560,531 A | * | 10/1996 | Ruszowski | B23K 1/008 228/264 |
| 5,890,646 A | * | 4/1999 | Tang | B23K 1/018 228/264 |
| 6,135,522 A | * | 10/2000 | Su | H05K 13/0409 414/752.1 |
| 6,182,884 B1 | * | 2/2001 | Ma | B23K 1/012 228/264 |
| 7,661,573 B2 | * | 2/2010 | Saito | B23K 3/04 228/19 |
| 8,434,670 B2 | * | 5/2013 | Okada | B23K 1/012 228/264 |
| 10,537,031 B2 | * | 1/2020 | Hillman | H01L 21/67144 |

(Continued)

*Primary Examiner* — Erin B Saad
(74) *Attorney, Agent, or Firm* — kinney & Lange, P.A.

(57) ABSTRACT

Apparatus and associated methods relate to removing an adhesively-attached component from a circuit board assembly. A complementary pair of high-permeability members are positioned on opposite sides of the circuit board assembly about the adhesively-attached component. Then, a magnetic field is induced within the complementary pair of high permeability members via a coil driver generating an AC current in an inductive coil circumscribing a central pedestal of the complementary pair of high-permeability members. The magnetic field induced is directed through the adhesively-attached component via a central pedestal located proximate the adhesively-attached component. A return path for the magnetic field is provided about a periphery of the adhesively-attached component via a peripheral pedestal.

20 Claims, 7 Drawing Sheets

(56) References Cited

U.S. PATENT DOCUMENTS

| | | | |
|---|---|---|---|
| 10,618,127 B2* | 4/2020 | Teraoka | B23K 1/018 |
| 2002/0117535 A1* | 8/2002 | Cox | B23K 1/018 |
| | | | 228/19 |
| 2006/0124705 A1* | 6/2006 | Kuczynski | H05K 3/3494 |
| | | | 228/221 |
| 2009/0175010 A1* | 7/2009 | Iriguchi | H05K 3/3494 |
| | | | 361/761 |
| 2014/0007428 A1* | 1/2014 | Beerens | H05B 6/38 |
| | | | 219/677 |
| 2015/0089805 A1* | 4/2015 | Ayotte | B23K 1/0016 |
| | | | 29/840 |
| 2017/0148762 A1* | 5/2017 | Ayotte | B23K 1/018 |
| 2022/0091483 A1* | 3/2022 | Low | G03B 17/55 |

* cited by examiner

SYSTEMS AND METHODS FOR REMOVING AN ADHESIVELY-ATTACHED COMPONENT FROM A CIRCUIT BOARD ASSEMBLY

BACKGROUND

Circuit board assemblies are ubiquitously produced for electronic products of a great many varieties. So common are circuit board assemblies, that one would be hard pressed to find a household that had no products containing a circuit board assembly. During the development and manufacture of such circuit board assemblies, various circumstances can result in rework of one of more circuit board assemblies. For example, during product development, rework can be performed to address a problem identified during such a development phase. Such testing can be performed so as to reduce the number of revisions to the production of the circuit boards. During the production phase of a product, rework can be performed on returned detective products. Such rework can be performed so as to replace the faulty product or simply to determine the cause of the fault.

Rework of circuit board assemblies requires careful localization of heating so as not to damage regions of such circuit board assemblies where rework is not desired. Localizing such heat can be difficult in practice, as heat is communicated via radiation, convection, and conduction, all three of which cause local heating to spread to adjacent regions. To reduce the undesirable spread of local heating, rapid heating and cooling techniques can be used. Thus, it would be desirable to find a method of providing local and rapid heating of a part adhesively attached to a circuit board assembly.

SUMMARY

Apparatus and associated methods relate to a system for removing an adhesively-attached component from a circuit board assembly. The system includes a complementary pair of high-permeability members, an inductive coil, and a coil driver. The complementary pair of high-permeability members are configured to be positioned on opposite sides of the circuit board assembly about the adhesively-attached component. The complementary pair of high-permeability members have a central pedestal and a peripheral pedestal, the central pedestal is configured to direct a magnetic field induced therein through the adhesively-attached component. The peripheral pedestal is configured to provide a return path for the magnetic field about a periphery of the adhesively-attached component. The inductive coil circumscribes the central pedestal of the complementary pair of high-permeability members. The coil driver is configured to generate an AC current in the inductive coil circumscribing the central pedestal, thereby inducing the magnetic field therein.

Some embodiments relate to a method for removing an adhesively-attached component from a circuit board assembly. The method includes positioning a complementary pair of high-permeability members on opposite sides of the circuit board assembly about the adhesively-attached component. The method includes inducing, via a coil driver generating an AC current in an inductive coil circumscribing a central pedestal of the complementary pair of high-permeability members, a magnetic flux therein. The method includes directing, via the central pedestal of a complementary pair of high-permeability members, the magnetic field through the adhesively-attached component. The method also includes providing, via a peripheral pedestal of the complementary pair of high-permeability members, a return path for the magnetic field about a periphery of the adhesively-attached component.

DETAILED DESCRIPTION

Figure 1:
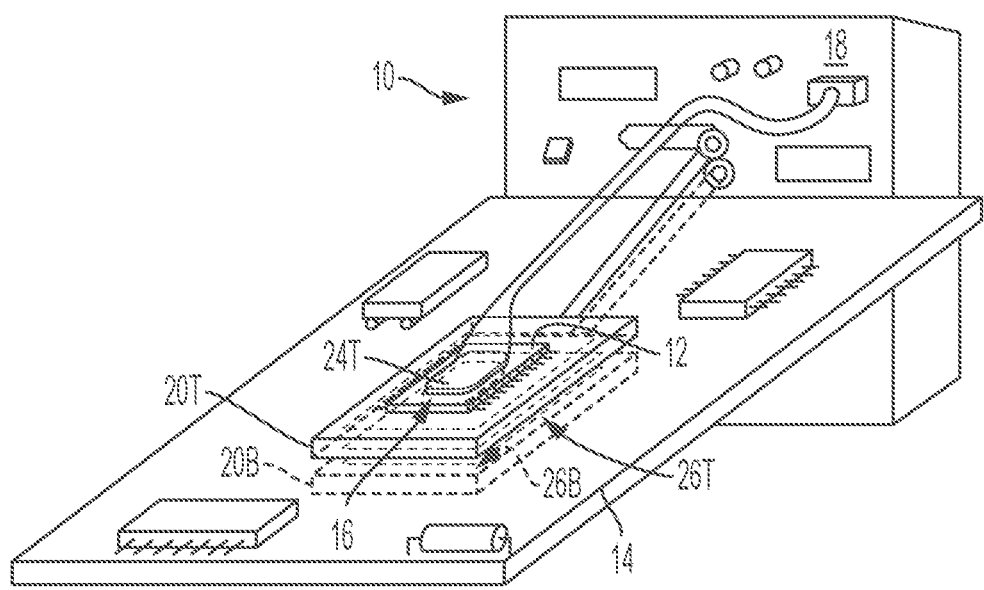
FIG. 1 is a perspective view of a component removal tool removing an adhesively-attached component from a circuit board assembly.

Apparatus and associated methods relate to removing an adhesively-attached component from a circuit board assembly. A complementary pair of high-permeability members are positioned on opposite sides of the circuit board assembly about the adhesively-attached component. Then, a magnetic field is induced within the complementary pair of high permeability members via a coil driver generating an AC current in an inductive coil circumscribing a central pedestal of the complementary pair of high-permeability members. The magnetic field induced is directed through the adhesively-attached component via a central pedestal located proximate the adhesively-attached component. A return path for the magnetic field is provided about a periphery of the adhesively-attached component via a peripheral pedestal FIG. 1 is a perspective view of a component removal tool removing an adhesively-attached component from a circuit board assembly. In FIG. 1, component removal tool 10 is in the process of removing adhesively-attached component 12 from circuit board assembly 14. Component removal tool 10 is configured to heat to adhesives that attach adhesively-attached component 12 from circuit board assembly 14, so as to reduce the adhesion of adhesively-attached component 12 to circuit board assembly 14. When such adhesives are heated, the adhesion of adhesively-attached component 12 to circuit board assembly 14 can be significant reduced so that removal of adhesively-attached component 12 from circuit board assembly 14 is possible. Various types of adhesives can be used to attach adhesively-attached component 12 to circuit board assembly 14. Various solders, metals, and other adhesives are commonly used to attach electronic components to such circuit board assemblies, such as circuit board assembly 14. Such various adhesives can be used for conductive connection between leads of adhesively-attached component 12 and conduction traces of circuit board assembly 14. Some adhesives can be used for physical attachment only of adhesively-attached component 12 and circuit board assembly 14.

Component removal tool 10 heats the adhesives used to attach adhesively-attached component 12 to circuit board assembly 14 either directly or indirectly using inductive heating techniques, as will be explained in more detail below. Component removal tool 10 includes coil driver 16, inductive coil 18, and complementary high-permeability members 20T and 20B. Complementary pair of high-permeability members 20T and 20B can be positioned on opposite sides of circuit board assembly 14 about adhesively-attached component 12. At least one of complementary pair the of high-permeability members 20T and 20B includes central pedestal 24T. In the depicted embodiment, top high-permeability member 20T includes central pedestal 24T. "Top" here refers to the one of complementary high-permeability members 20T and 20B that is situated on the same side of circuit board assembly 14 as the side that adhesively-attached component 12 is situated. The term "bottom" is used to refer to the other one of complementary high-permeability members 20T and 20B that is situated on the opposite side of circuit board assembly 14 as the side that adhesively-attached component 12 is situated. The terms "top" and "bottom" need not be indicative of a particular orientation of circuit board assembly 14. Instead, the terms "first" and "second" can be used to distinguish between complementary high-permeability members 20T and 20B.

A magnetic field can be induced in complementary high-permeability members 20T and 20B via inductive coil 16 circumscribing central pedestal 24T of the complementary pair of high-permeability members 20T and 20B. Coil driver 18 is configured to generate an AC current in inductive coil 16 circumscribing central pedestal 24T, thereby inducing the magnetic field therein. Because high-permeability members 20T and 20B are made of high-permeability materials, any magnetic fields induced therein are channeled via the high-permeability members so as to minimize losses to the magnetic field induced. The magnetic field takes the path of "least resistance," which is a metaphor for the closed path of highest permeability. By directing the magnetic field, via complementary high-permeability members 20T and 20B, complementary high-permeability members 20T and 20B shield from magnetic field exposure circuitry outside an interior cavity defined by interior surfaces of high-permeability members 20T and 20B. Only the circuitry within such a cavity will be exposed to the magnetic field.

At least one of complementary pair the of high-permeability members 20T and 20B has a peripheral pedestal. In the depicted embodiment both top and bottom high-permeability members 20T and 20B have central pedestals—central pedestals 26T and 26B, respectively. Central pedestal 24T is configured to direct a magnetic field induced therein through the adhesively-attached component. Peripheral pedestals 26T and 26B are configured to provide a return path for the magnetic field about a periphery of the adhesively-attached component.

In operation, complementary high-permeability members 20T and 20B are positioned on opposite sides of the circuit board assembly about the adhesively-attached component 12. High-permeability members 20T and 20B are positioned in clam-shell fashion so as to substantially enclose adhesively-attached component 12 within the interior cavity defined by interior surfaces of high-permeability members 20T and 20B. A magnetic field is then induced within high-permeability members 20T and 20B via AC excitation of inductive coil 16 by coil driver 18. The magnetic field induced is directed through adhesively-attached component 12 so as to induce AC currents with any conductive material within or below adhesively-attached component 12, thereby heating such conductive materials. Any solders, leads, circuit board traces, etc., which are located in this region where the magnetic field is directed will then heat due to these induced AC currents. Such heating can either directly heat the adhesives (e.g., if solder adhesives are located in this region) or indirectly heat the adhesives (e.g., via thermal conduction from the heated conductive materials to the adhesives).

One the adhesives have been heated, adhesively-attached component 12 can be removed from circuit board assembly 14. Various methods of removing adhesively-attached component 12 from circuit board assembly 14 can be employed. For example, top high-permeability member 20T can be raised, and adhesively-attached component 12 can be manually removed using a tool, tweezers, etc. In some embodiments, top high-permeability member 20T can be equipped with a suction system to as to vacuum attach top high-permeability member 20T to a top surface of adhesively-attached component 12. Then, by raising top high-permeability member 20T, vacuum attached component 12 will be removed thereby.

Figure 2:
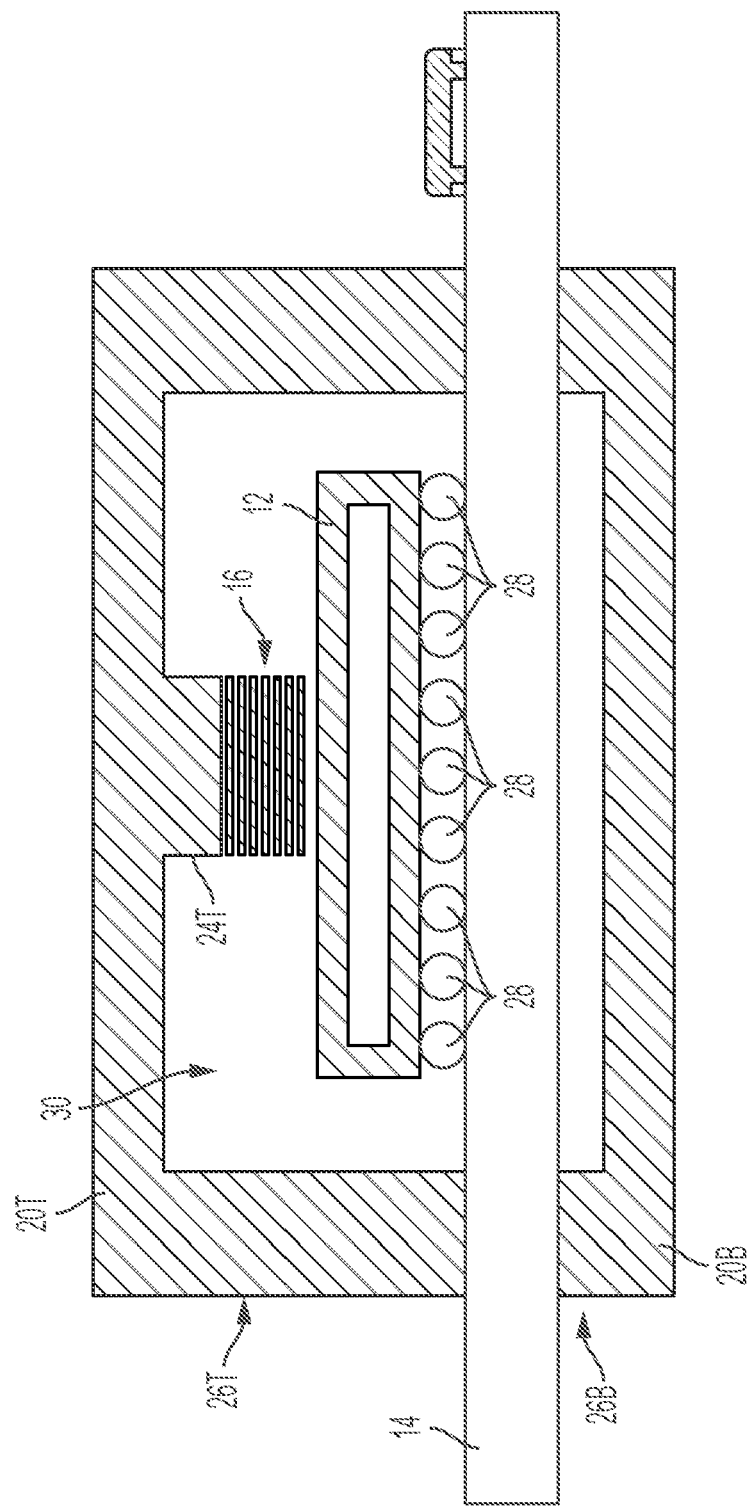
FIG. 2 is a side-elevation view of an embodiment of a component removal tool configured to inductively heat an adhesively-attached component.

FIG. 2 is a side-elevation view of an embodiment of a component removal tool configured to inductively heat an adhesively-attached component. In FIG. 2, adhesively attached component 12, is shown attached to circuit board assembly 14 via solder balls 28. Top high-permeability member 20T includes central pedestal 24T and peripheral pedestal 26T. Bottom high-permeability member 20B includes peripheral pedestal 26B. Inductive coil 16 is wound about central pedestal 24T. Top high-permeability member 20T together with circuit board assembly 14 forms cavity 30, within which adhesively-attached component 12 is substantially enclosed or encapsulated. Bottom high-permeability member 20B is aligned with top high-permeability member 20T so as to facilitate maximize the permeability throughout a closed path about and through adhesively-attached component 12. Such maximization of the permeability throughout the closed circuit path facilitates high magnetic-field strength, thereby producing high indictive heating of conductive elements that intercept the closed path.

Figure 3:
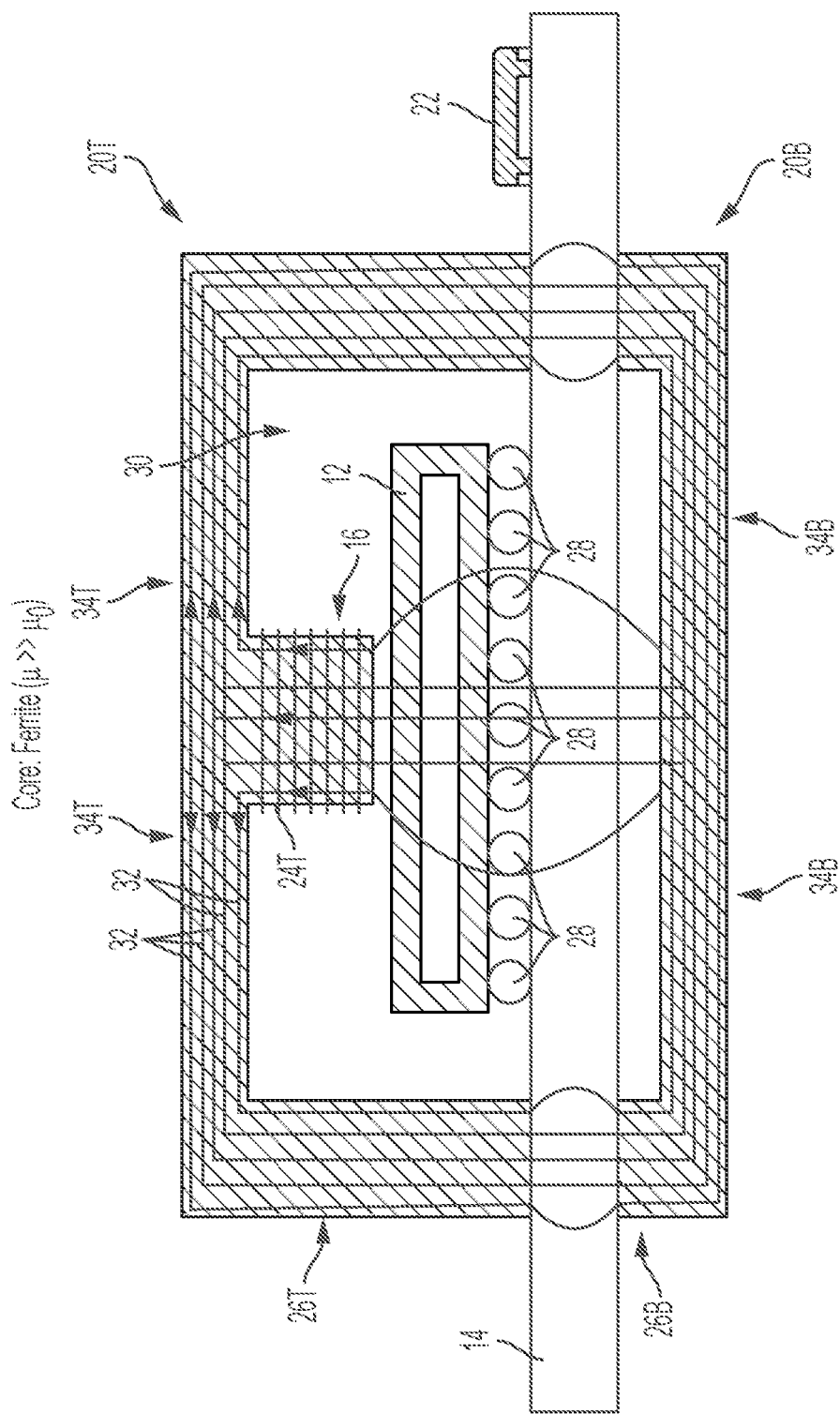
FIG. 3 is a side-elevation view of the component removal tool depicted in FIG. 2 with the magnetic flux indicated therein.

FIG. 3 is a side-elevation view of the component removal tool depicted in FIG. 2 with the magnetic flux indicated therein. In FIG. 3, the system depicted in FIG. 2 is annotated with magnetic field lines 32. Magnetic field lines 32 traverse a close path about and through adhesively-attached component 12. Magnetic field lines 32 correspond to a magnetic field induced by an AC current in inductive windings 16. Such an AC current in inductive windings 16 will induce a current in central pedestal 24T about which inductive windings are wound. This magnetic field will be directed about inductive windings 16 in a manner that traverses a path of least magnetic reluctance. Magnetic reluctance is inversely related to magnetic permeability. Thus, the magnetic field lines 32 will be preferentially directed in a path within high-permeability members 20T and 20B, as shown in the figure. Thus, magnetic field lines 32 traverse a path: i) from central pedestal 24T up to lateral field region 34T of top high-permeability member 20T; ii) then laterally outward from central pedestal 24T within lateral field region 34T to peripheral pedestal 26T; iii) then downward through peripheral pedestal 26T through circuit board assembly 14 to peripheral pedestal 26B; iv) then from peripheral pedestal 26B to lateral field region 34B; v) then laterally inward from peripheral pedestal 26B to a central region of bottom high-permeability member 20B; vi) then upward through circuit board assembly 14, solder balls 28, and adhesively-attached component 12, and back to central pedestal 24T again. Because magnetic field lines traverse circuit board assembly 14, solder balls 28, and adhesively-attached component 12, conductive elements, such as solder balls 28 within such a magnetic field will be inductively heated.

Thus, these lateral field regions 34T and 34B provide connect any central pedestals 24T and 24B (if present) with any peripheral pedestals 26T and 26B (if present), respectively. Furthermore, any central pedestals 24T and 24B as well as any peripheral pedestals 26T and 26B extends from such lateral field regions 34T and 34B, respectively.

This path in which the magnetic field is direction includes an annular region of circuit board assembly 14 that circumscribes adhesively-attached component 12 and a central region of adhesively-attached component 12 and a corresponding adjacent region of circuit board assembly 14. This central region through which the magnetic field is directed is proximate and defined by central pedestal 24. Peripheral pedestal 26T is located between adhesively-attached component 12 and other devices affixed to the circuit board assembly adjacent to the adhesively-attached components, such as, for example additional component 22. Additional component 22 is shielded from exposure to the magnetic field by complementary high-permeability members 20T and 20B.

Figure 4:
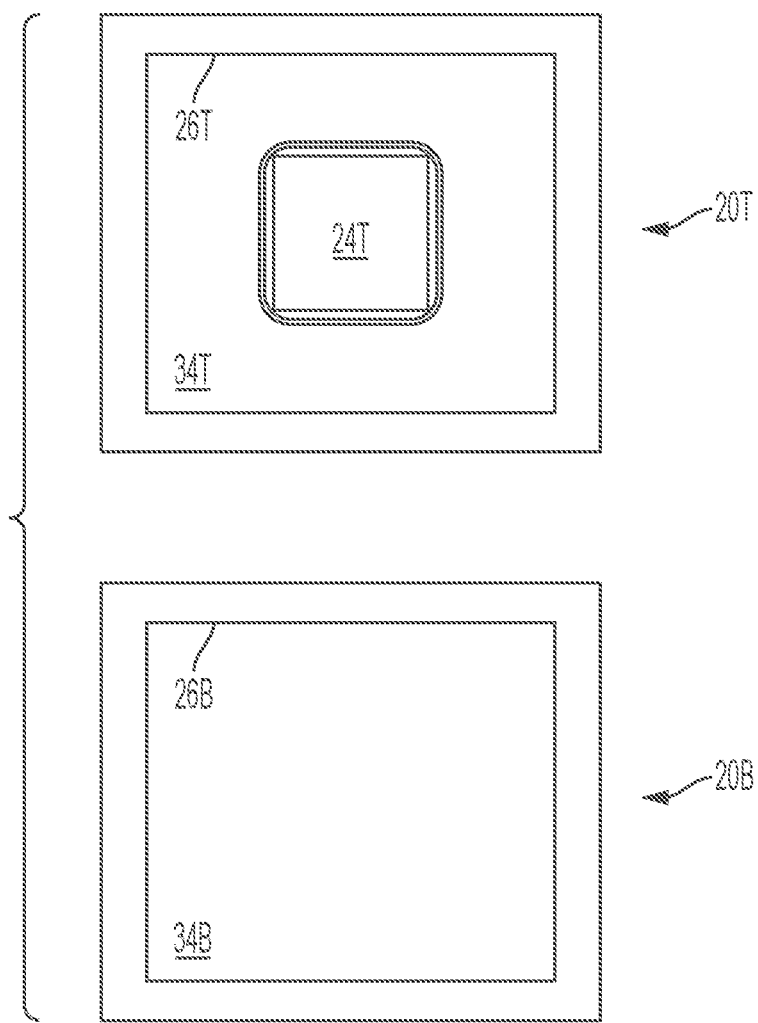
FIG. 4 is a plan view of the FIG. 2 embodiment of a component removal tool configured to inductively heat an adhesively-attached component.

FIG. 4 is a plan view of the FIG. 2 embodiment of a component removal tool configured to inductively heat an adhesively-attached component. In FIG. 4, top and bottom high-permeability members 20T and 20B are depicted in plan view so as to appreciate a lateral extent of an example embodiment. Top high-permeability member 20T includes central pedestal 24T, peripheral pedestal 26T, lateral field region 34T, and inductive windings 16. In the depicted embodiment, central pedestal 24T has a square configuration. In some embodiments, central pedestal can be circular, rectangular or any other geometry appropriate for the specific adhesively-attached component to be extracted. About central pedestal 24T are show inductive windings 16. In the depicted embodiment, peripheral pedestal 26T is an annular pedestal that circumscribes central pedestal 24T without interruption. In some embodiments, in which the specific circuit board assembly requires interruption (e.g., due to a component located within the peripheral pedestal region), peripheral pedestal 26T can have one or more interruptions in its otherwise annular geometry.

Bottom high-permeability member 26B includes peripheral pedestal 26B and lateral field region 34B only. In other embodiments, bottom high-permeability member 26B can have a central pedestal as well as other features. For example, bottom high-permeability member can include an inductive coil, such as inductive coil 16 either in addition to or instead of inductive coil 16 wound about central pedestal 24T of top high-permeability member 20T. In some embodiments, peripheral pedestals 26T and 26B are complementary such that, when aligned with one another, peripheral pedestals 26T and 26B are substantially coextensive in their lateral dimensions.

Figure 5:
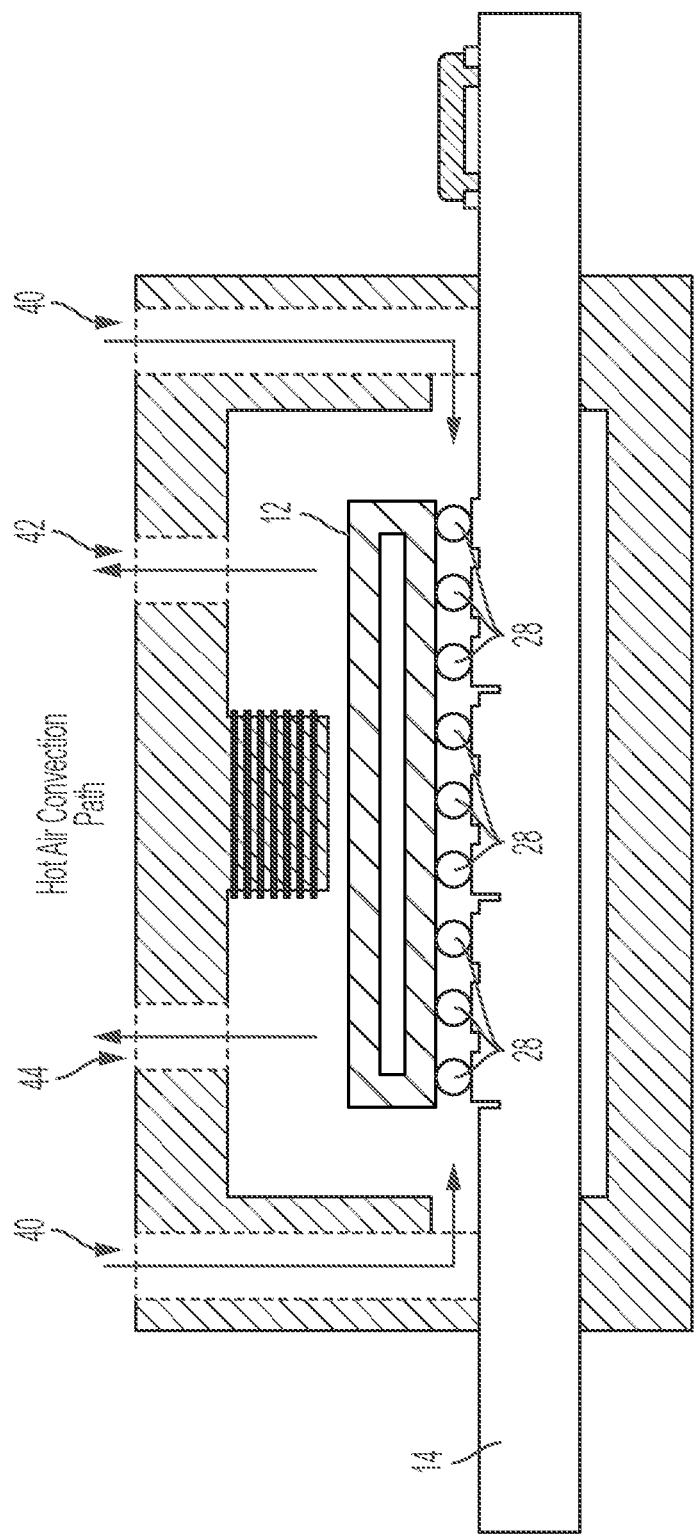
FIG. 5 is a side-elevation view of an embodiment of a component removal tool that facilitates both inductive and convective heating.

FIG. 5 is a side-elevation view of an embodiment of a component removal tool that facilitates both inductive and convective heating. In FIG. 5, adhesively attached component 12, is shown attached to circuit board assembly 14 via solder balls 28. Top high-permeability member 120T differs from those shown in the embodiments depicted in FIGS. 1-4. Top high-permeability member 120T is configured both to direct the magnetic field induced by inductive coil 16, and to facilitate circulation of heated air into and out of cavity 30. To facility the circulation of heated air, top high-permeability member 120T includes input apertures 40, and output apertures 42. Such apertures can be used to provide circulation of heated air within cavity 30, which can be produced by a forced air heating system. Input and second apertures are thus configured to provide a circulatory path for convective heating therethrough. For example, a force air heater can force air into input apertures 40 and then receive air exhausted from output apertures 42.

Figure 6:
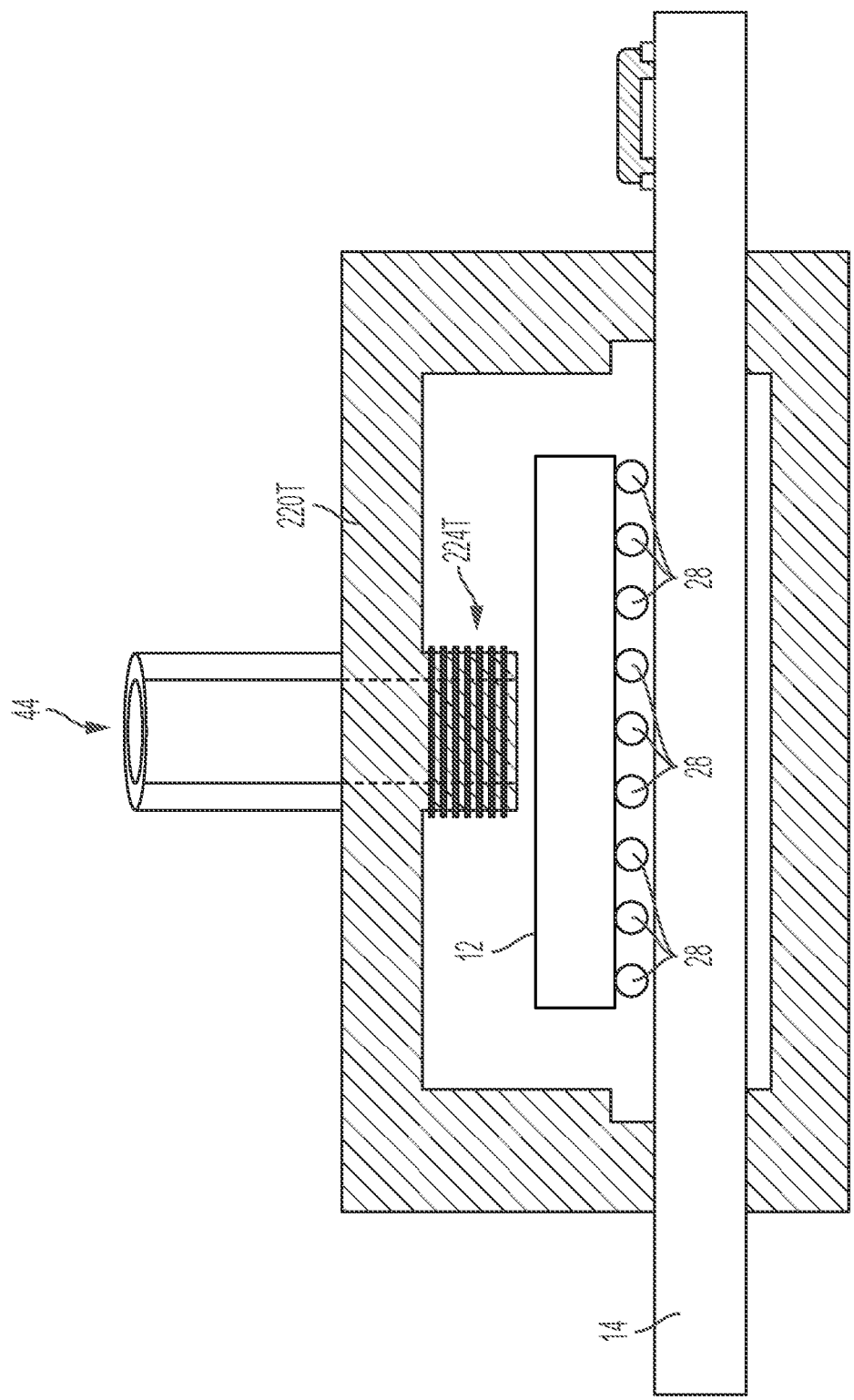
FIG. 6 is a side-elevation view of an embodiment of a component removal tool that includes a part extractor using vacuum technology.

FIG. 6 is a side-elevation view of an embodiment of a component removal tool that includes a part extractor using vacuum technology. In FIG. 6, adhesively attached component 12, is shown attached to circuit board assembly 14 via solder balls 28. Top high-permeability member 220T differs from those shown in the embodiments depicted in FIGS. 1-5. Top high-permeability member 220T includes part suction port 44. Part suction port 44 is a central aperture from an outside surface of top high-permeability member 220T through central pedestal 224T. A vacuum system can be fluidly connected to part suction port 44 so as to provide a suction that can cause central pedestal 224T to engage adhesively-attached component 12. Then, when solder balls 28 have melted (e.g., during reflow of the solder balls), top high-permeability member 220T can be removed, thereby removing component 12, whose melted solder balls 28 no longer provide adhesive attachment between component 12 and circuit board assembly 14. Part suction port 44 can be located in various other configurations, such as, for example, adjacent to central pedestal 224T. In some embodiments, for example, an annular aperture can circumscribe central pedestal 224T so as to provide an annular suction seal with adhesively-attached component 12.

Figure 7:
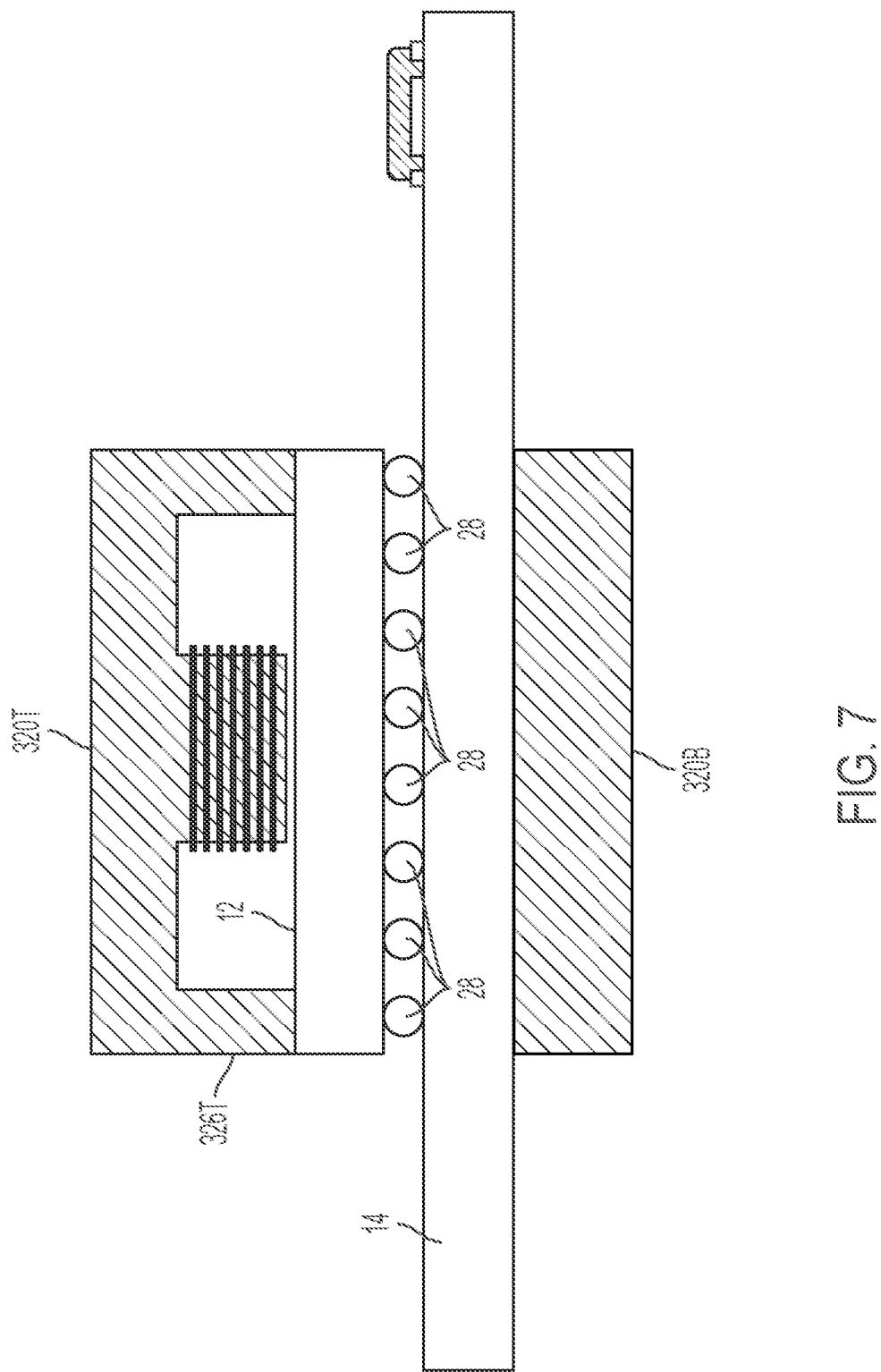
FIG. 7 is a side-elevation view of an embodiment of a component removal tool having a peripheral flux-transmission member configured to align upon a periphery of a component.

FIG. 7 is a side-elevation view of an embodiment of a component removal tool having a peripheral flux-transmission member, such as peripheral pedestal 326T configured to align upon a periphery of a component. In FIG. 7, adhesively attached component 12, is shown attached to circuit board assembly 14 via solder balls 28. Both top and bottom high-permeability member 320T and 320B differ from those shown in the embodiments depicted in FIGS. 1-6. Bottom high-permeability member 320B includes no central pedestal or peripheral pedestal. Such a bottom high-permeability member, as bottom high-permeability member 320B can be used for circuit board assemblies, such as circuit board assembly 14, which have a planar surface on the bottom side adjacent to bottom high-permeability member 120B. Top high-permeability member 320T also differs in that peripheral pedestals 326T are configured to direct the magnetic field induced within top high-permeability member 320T through an annular periphery of adhesively-attached component 12. Thus, instead of directing the magnetic field through only circuit board assembly 14 in an annular region circumscribing adhesively-attached component 12, in the depicted embodiment, the magnetic field is directed through both the adhesively-attached component 12 and circuit board assembly 14. Thus, the magnetic field directed through such an annular region of adhesively-attached component 12 can provide additional inductive heating of conductive elements located in such an annular region.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A system for removing an adhesively-attached component from a circuit board assembly, the system comprising:
a complementary pair of magnetic field channeling members configured to be positioned on opposite sides of the circuit board assembly about the adhesively-attached component, the complementary pair of high-permeability members having a central pedestal and a peripheral pedestal, the central pedestal configured to direct a magnetic field induced therein through the adhesively-attached component, the peripheral pedestal configured to provide a return path for the magnetic field about a periphery of the adhesively-attached component, wherein the complementary pair of magnetic field channeling members are made of magnetically permeable materials that have a magnetic permeability sufficient to facilitate channeling of any magnetic fields induced within the magnetic field channeling members therein;
an inductive coil circumscribing the central pedestal of the complementary pair of magnetic field channeling members; and
a coil driver configured to generate an AC current in the inductive coil circumscribing the central pedestal, thereby inducing the magnetic field therein.

2. The system of claim 1, wherein the return path includes an annular region of the circuit board assembly substantially circumscribing the periphery of the adhesively-attached component.

3. The system of claim 1, wherein the return path includes a portion of the circuit board assembly between the adhesively-attached component and other devices affixed to the circuit board assembly adjacent to the adhesively-attached component.

4. The system of claim 1, wherein a first of the complementary pair of magnetic field channeling members includes input and output apertures configured to provide a circulatory path for convective heating therethrough.

5. The system of claim 4, further comprising:
a forced air heater configured to force heated air into the input aperture and to receive the heated air exhausted from the output aperture.

6. The system of claim 1, wherein a first of the complementary pair of magnetic field channeling members includes the peripheral pedestal, which is configured to engage the circuit board assembly adjacent to the periphery of the adhesively-attached component.

7. The system of claim 1, wherein both the central pedestal and the peripheral pedestal extend from a first of the complementary pair of magnetic field channeling members.

8. The system of claim 1, wherein the central pedestal extends form a lateral field region of a first of the complementary pair of magnetic field channeling members and the peripheral pedestal extends from a second of the complementary pair of magnetic field channeling members.

9. The system of claim 1, wherein the peripheral pedestal is configured engage the circuit board assembly about the periphery of the adhesively-attached component so as to encapsulate the adhesively-attached component between a first of the complementary pair of magnetic field channeling members and the circuit board assembly.

10. The system of claim 1, further comprising:
a component extractor configured to engage the adhesively-attached component so as to extract the adhesively-attached component during reflow of solder.

11. A method for removing an adhesively-attached component from a circuit board assembly, the method comprising:
positioning a complementary pair of magnetic field channeling members on opposite sides of the circuit board assembly about the adhesively-attached component, wherein the complementary pair of magnetic field members are made of magnetically permeable materials that have a magnetic permeability sufficient to facilitate channeling of any magnetic fields induced within the magnetic field channeling members therein;
inducing, via a coil driver generating an AC current in an inductive coil circumscribing a central pedestal of the complementary pair of magnetic field channeling members, a magnetic flux therein;
directing, via the central pedestal of a complementary pair of magnetic field channeling members, the magnetic field induced through the adhesively-attached component; and
providing, via a peripheral pedestal of the complementary pair of magnetic field channeling members, a return path for the magnetic field about a periphery of the adhesively-attached component.

12. The method of claim 11, wherein the return path includes an annular region of the circuit board assembly substantially circumscribing the periphery of the adhesively-attached component.

13. The method of claim 11, wherein the return path includes a portion of the circuit board assembly between the adhesively-attached component and other devices affixed to the circuit board assembly adjacent to the adhesively-attached component.

14. The method of claim 11, wherein a first of the complementary pair of magnetic field channeling members includes input and output apertures configured to provide a circulatory path for convective heating therethrough.

15. The method of claim 14, further comprising:
forcing, via a forced air heater, heated air into the input aperture; and
receiving, the heated air exhausted from the output aperture.

16. The method of claim 11, wherein a first of the complementary pair of magnetic field channeling members includes the peripheral pedestal, which is configured to engage the circuit board assembly adjacent to the periphery of the adhesively-attached component.

17. The method of claim 11, wherein both the central pedestal and the peripheral pedestal extend from a first of the complementary pair of magnetic field channeling members.

18. The method of claim 11, wherein the central pedestal extends form a lateral field region of a first of the complementary pair of magnetic field channeling members and the peripheral pedestal extends from a second of the complementary pair of magnetic field channeling members.

19. The method of claim 11, wherein the peripheral pedestal is configured engage the circuit board assembly about the periphery of the adhesively-attached component so as to encapsulate the adhesively-attached component between a first of the complementary pair of magnetic field channeling members and the circuit board assembly.

20. The method of claim 11, further comprising:
engaging, via a component extractor, the adhesively-attached component; and
extracting, via the component extractor, the adhesively-attached component during reflow of solder.

\* \* \* \* \*